United States Patent [19]

Calawa et al.

[11] 4,323,422

[45] Apr. 6, 1982

[54] METHOD FOR PREPARING OPTICALLY FLAT DAMAGE-FREE SURFACES

[76] Inventors: Arthur R. Calawa, 6 Abbott La., Chelmsford, Mass. 01824; Joseph V. Gormley, 14 Gail Rd., Merrimack, N.H. 03054; Michael J. Manfra, 240 N. Billerica Rd., Tewksbury, Mass. 01876

[21] Appl. No.: 143,380

[22] Filed: Apr. 24, 1980

[51] Int. Cl.$^3$ .......................................... H01L 21/306
[52] U.S. Cl. .................... 156/636; 156/345; 156/662; 252/79.1
[58] Field of Search ............... 252/79.1; 156/636, 662, 156/345; 51/131.2, 131.3, 132, 281 SF

[56] References Cited

U.S. PATENT DOCUMENTS

| | | | |
|---|---|---|---|
| 3,073,764 | 1/1963 | Sullivan | 156/636 |
| 3,156,596 | 11/1964 | Sullivan | 156/636 |
| 3,342,652 | 9/1967 | Reisman et al. | 156/636 |
| 3,437,543 | 4/1969 | Winingg | 156/345 |
| 3,629,023 | 12/1971 | Stehlow | 156/636 |

*Primary Examiner*—Jerome W. Massie
*Attorney, Agent, or Firm*—Robert F. O'Connell

[57] ABSTRACT

A method and apparatus for polishing surfaces so as to provide surfaces which are optically flat and damage free. An etch solution is applied to a rotating surface and the surface to be prepared is caused by hydroplane on the etch solution, the hydroplaning action producing the desired optically flat surface.

2 Claims, 3 Drawing Figures

METHOD FOR PREPARING OPTICALLY FLAT DAMAGE-FREE SURFACES

The Government has rights in this invention pursuant to Contract Number AF19(628)-80-C-0002 awarded by the U.S. Department of the Air Force.

INTRODUCTION

This invention relates generally to methods and apparatus for polishing surfaces and, more particularly, to a method and apparatus for providing optically-flat, damage-free surfaces using hydroplaning techniques.

BACKGROUND OF THE INVENTION

In many applications, it is desirable to provide surfaces which are essentially optically flat and free of damage. Such surface characteristics are desired, for example, for semiconductor surfaces used for the growth of epitaxial layers or for the fabrication of semiconductor devices. Epitaxial growth defects and low device yields can often be attributed to the damage introduced into a semiconductor substrate during the polishing of the surface thereof. Such problems are particularly noticeable when the substrate surface is used for molecular beam epitaxial (MBE) growth where substrate surface preparation tends to be more critical than for liquid phase epitaxial (LPE) growth or vapor phase epitaxial (VPE) growth.

DISCUSSION OF THE PRIOR ART

Prior art surface preparation techniques include chemically-free etching which, while tending to provide no more damage than the bulk crystal, does tend to produce surfaces which are generally not optically flat. Presently known chemical/mechanical polishing techniques (often times referred to as "chem-mechanical" polishing) result in varying degrees of damage to surfaces. While subsequent chemical free etching techniques can be used to remove such damage, undesirable rounding of the surfaces occurs as a result. Vapor etching techniques can be used to produce damage-free surfaces although such techniques do not produce optically flat surfaces.

BRIEF SUMMARY OF THE INVENTION

In accordance with the method and apparatus discussed with respect to the invention, hydrodynamic forces are used to provide a hydroplaning of semiconductor samples on a layer of an etch solution. The rapidly moving etch solution removes surface material at rates which are much faster than presently known techniques and the use of such a hydroplaning principle produces both optically flat and damage-free surfaces. The method of the invention can be readily implemented in a suitable apparatus and the overall process can be appropriately automated for many applications.

DESCRIPTION OF THE INVENTION

The specific embodiment of the method and apparatus of the invention can be described in more detail particularly with the help of the accompanying drawing wherein.

Figure 1:
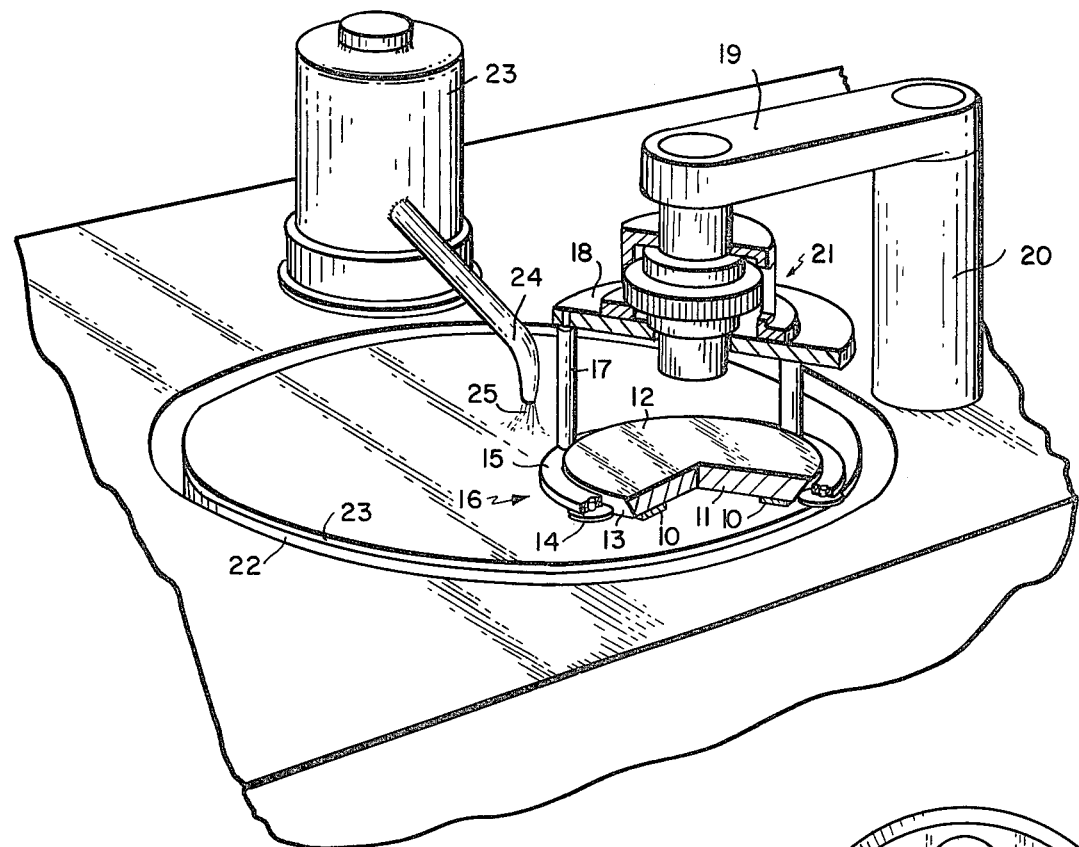
FIG. 1 depicts a view in perspective of a specific embodiment of an apparatus for performing the method of the invention for use in polishing the surfaces of a plurality of samples of materials.
Figure 3:
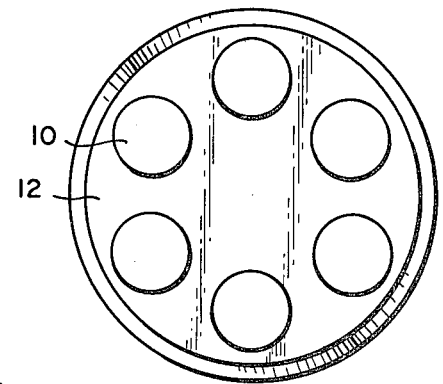
FIG. 3 depicts a plan view of a portion of the embodiment of FIG. 1.

As can be seen in the figures, a plurality of samples 10 of a semiconductor material, for example, are suitably mounted to a surface 11 of a mounting block, such as a quartz, optical flat 12 (shown partially broken away in FIG. 1) which is freely movable as discussed in more detail below. The samples may be mounted using a suitable mounting wax or other appropriate adhesive material so that the samples can be readily removed following the polishing operation.

The optical flat 12 has a tapered edge 13 which rests on a plurality of rotatable idler wheels 14 which are in turn mounted on a ring member 15. Ring 15 is formed as part of a frame member 16 which includes a plurality of support posts 17 attached at one end to ring 15 and at the other end to a platform 18. Platform 18 is mounted at the end of an arm member 19 which is supported by a post 20. The platform 18 and, hence, the quartz flat 12 can be raised and lowered by means of any suitable mechanism, in this case a thumb screw 21, for example. Idler wheels 14 can be formed so as to have bearing surfaces made of a suitable material, such as Teflon, for example, in order to prevent corrosion.

Quartz flat 12 is positioned above the upper surface of a polishing wheel 22 which is mounted below the quartz flat holding fixture in a manner so as to be freely rotatable. The upper surface of polishing wheel 22 can be covered by a suitable polishing cloth 23, such a polyurethane or silk cloth, or the like. In performing the polishing operation the fixture which carries the samples to be polished is gently lowered until the surfaces of the samples are close but do not contact the surface of the polishing wheel. For example, in polishing the surfaces of gallium arsenide (GaAs) or indium phosphide (InP) semiconductor wafers, the surfaces are placed at a position within 0.005 inches of the polishing wheel surface.

An etch solution 25 from a supply tank 23 thereof is directed to the surface of polishing wheel 22 via spout 24 at a location reasonably near the center of the polishing wheel. For example, for polishing GaAs and InP semiconductor samples, an etch solution comprising a mixture of methanol, ethylene glycol and a small percentage of bromine can be used.

Figure 2:
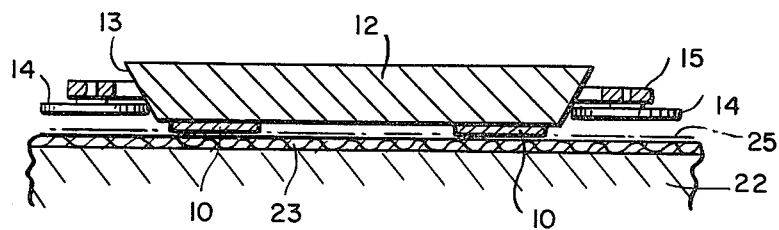
FIG. 2 depicts a view in cross-section of a portion of the embodiment of FIG. 1.

The polishing wheel is rotated at an exemplary speed of rotation of 1200 rpm, for example, as the etch solution is applied, thereby causing the solution to spin rapidly on the surface thereof. The force of the rapidly spinning solution which comes into contact with the samples causes the quartz flat to rotate at a relatively higher rotating speed, e.g. 1800 rpm. As the edges of the sample are etched by the etch solution, they become slightly rounded and a component of the force from the etch solution provides a lift to the samples and, hence, to the quartz optical flat 12 so that the samples hydroplane on a relatively thin layer of the etch solution, as shown in FIG. 2.

A successful hydroplaning operation depends on the viscosity and the surface tension of the etch solution. The selection of a suitable etch solution having the desired viscosity and surface tension can be made empirically. Thus, the concentrations of the components of the specific etch solution discussed above and the rotating speed of the polishing wheel determine the viscosity and surface tension that are required so as to provide a desired etch rate. As the viscosity of the fluid is increased, the force of the spinning fluid on the initially stationary quartz flat is increased to a point where such force is large enough to start the quartz flat spinning. The cloth covering the surface of the polishing wheel prevents the solution from moving too rapidly from the center to, and off, the edge of the wheel. That solution which spins off the edge of the wheel can be appropriately collected and resupplied to the etching solution tank 23 for reuse.

Since the surface tension of the fluid varies monotonically with the viscosity thereof, the force which pulls the spinning quartz flat toward the surface of the polishing wheel increases with increased viscosity. Such a force counteracts the hydroplaning force and may become large enough to distort the idler wheel and cause the surfaces of the samples to come into contact with the upper surface of the polishing wheel. If such contact occurs the samples will be severely damaged. Thus, the viscosity of the fluid must be selected so as to be sufficiently large to overcome the inertia of the quartz optical flat 12 and yet sufficiently low so that the surface tension is not strong enough to overcome the hydroplaning force.

For the particular etched solution discussed above, for use with GaAs or InP materials, a ratio of 90 parts of methanol to 10 parts of ethylene glycol provides a solution having a useful viscosity for such purposes. The amount of bromine used therein can vary from a few tenths of a percent up to as high as one percent to achieve good results, the amount used varying the etch rate accordingly. Etch rates, for example, from about 2 $\mu$m/min. to about 30 $\mu$m/min. over a range of bromine from about 0.1% to about 1% in the solution have been achieved when used with gallium arsenide material. With reference to indium phosphide material utilizing the same solution of methanol and ethylene glycol, the etch rates can be varied from about 2 $\mu$m/min. to about 16 $\mu$m/min. for a bromine content from about 0.1% to about 0.8%. As mentioned above, the etch rate in each case increases with increasing amounts of bromine.

For GaAs and InP semiconductor materials, an etch rate of about 10 $\mu$meters/min. appears to be a desirable one. While slower etch rates can be used for precise thickness control as desired, the etching process may become more time consuming then desired. Higher etch rates, on the other hand, may tend to produce an orange-peel looking surface which surface appearance is more characteristic of free-etching processes.

If more than about 50 $\mu$meters of the surface material is removed from the semiconductor sample, the samples will stop spinning and the quartz flat position above the polishing wheel must be readjusted by lowering the samples again to a desired height above the wheel surface to bring about the spinning operation again. Alternatively, a suitable process for automatically lowering the samples as the surfaces are etched away can be utilized within the skill of the art.

In an exemplary embodiment of the invention using one-inch diameter samples, the above technique has been found to provide an optically flat surface to within 0.3 $\mu$meters over 80% of the sample surface, the surface thereof being substantially completely free of damage. The rate at which such surfaces are etched is such that the overall polishing time can be reduced by as much as ten to several hundred times less than that required when using prior art etching techniques.

The use of such techniques and apparatus of the invention has been discussed above with reference to the polishing of semiconductive materials. However, such techniques can be utilized for polishing other materials so long as a suitable etch solution can be found for such purpose and so long as the solution does not adversely affect the fixture including the quartz flat and the other materials used for the fixture. The viscosities and etch rates which are used can be empirically determined to optimize the overall operation as discussed above and will depend upon the materials and the etch solution which are used. The selection of materials and etch rate materials, their viscosity and etch rates will depend on the particular application and can be determined by those in the art in accordance with the above principles of operation.

Other modifications of the particular embodiment of the invention described above may occur to that in the art within the spirit and scope of the invention. Hence, the invention is not to be construed as limited to the specific implementation shown and described herein except as defined by the appended claims.

What is claimed is:

1. A method for preparing optically flat surfaces of a semiconductor material comprising the steps of
   placing a first surface to be prepared adjacent, but not in contact with, a second surface, said first and second surfaces being movable relative to each other, said first surface being freely positioned relative to said second surface so that the distance therebetween can be freely varied;
   applying a fluid selected from a mixture of methanol, ethylene glycol and bromine to said second surface to form a fluid layer between said first and second surfaces, the viscosity of said fluid and the speed of the relative movement of said surfaces being selected to be sufficiently high to cause said first surface to hydroplane on said fluid and said viscosity being sufficiently low that the surface tension of said fluid does not prevent the hydroplaning action, the hydroplaning action thereby removing portions of said first surface in a manner so as to cause said first surface to become optically flat.

2. A method in accordance with claim 1 wherein said mixture is selected to provide a solution which comprises 90 parts of methanol to 10 parts of ethylene glycol and said bromine is selected to be within a range from about 0.1 percent to about 1.0 percent of said solution.

* * * * *

UNITED STATES PATENT AND TRADEMARK OFFICE
CERTIFICATE OF CORRECTION

PATENT NO. : 4,323,422

DATED : April 6, 1982

INVENTOR(S) : Arthur R. Calawa, Joseph V. Gormley, and Michael J. Manfra

It is certified that error appears in the above-identified patent and that said Letters Patent are hereby corrected as shown below:

On the front page of the patent please add the following:

Assignee: Massachusetts Institute of Technology
Cambridge, Massachusetts

Signed and Sealed this

Twenty-first Day of September 1982

[SEAL]

Attest:

GERALD J. MOSSINGHOFF

Attesting Officer — Commissioner of Patents and Trademarks